United States Patent [19]

Sobczak

[11] Patent Number: 4,576,834
[45] Date of Patent: Mar. 18, 1986

[54] METHOD FOR FORMING TRENCH ISOLATION STRUCTURES

[75] Inventor: Zbigniew P. Sobczak, Colorado Springs, Colo.

[73] Assignee: NCR Corporation, Dayton, Ohio

[21] Appl. No.: 735,515

[22] Filed: May 20, 1985

[51] Int. Cl.⁴ .................................. H01L 21/316
[52] U.S. Cl. .................................. 427/93; 427/240; 427/259; 156/652; 156/653; 29/576 W
[58] Field of Search .............. 427/93, 240, 259; 156/652, 653

[56] References Cited

U.S. PATENT DOCUMENTS 4,222,792  9/1980  Lever .................................. 427/93
4,305,974 12/1981  Abe ..................................... 427/93
4,377,619  3/1983  Schonhorn ........................... 427/96

Primary Examiner—John D. Smith
Attorney, Agent, or Firm—Wilbert Hawk, Jr.; Casimer K. Salys

[57] ABSTRACT

A streamlined process for forming a fully recessed, self-planarized dielectric isolation structure involves selectively depositing organosilicon material such as orthosilicate esters or siloxane resins in substrate trenches without build-up on adjacent substrate steps, which steps are coated with a non-wetting polymer material such as fluorocarbon compounds, then converting the organosilicon material to silicon oxide by heating at about 200° C.-900° C.

7 Claims, 5 Drawing Figures

METHOD FOR FORMING TRENCH ISOLATION STRUCTURES

BACKGROUND OF THE INVENTION

This invention relates to processes for electrically isolating semiconductor devices and components in monolithic integrated circuits. In particular, the invention is a process for forming fully recessed, planarized dielectric isolation structures such as field oxides. The process involves the selective deposition of organosilicon material into trenches or depressions, followed by conversion of the organosilicon to oxide.

For some time, dielectric isolation has been a preferred technology for isolating integrated circuits and their constituent devices and elements. Integrated circuit isolation by the so-called local oxidation of silicon (LOCOS) has been known for a number of years, as have its problems. The well-known limitations of the LOCOS process include several factors which may limit its applicability to small geometry, highly dense VLSI structures. These limitations include the lateral oxide diffusion and oxidation formation (the so-called "bird's beak" configuration) beneath the nitride oxidation mask. This enlargement of the isolation field oxide and the associated encroachment into the active regions limits the percentage of chip surface area which is available for device formation. Also, the characteristic non-planar semi-recessed surface topography and the rough surface topography of the bird's head regions hinder metallization coverage as well as the high resolution photolithographic operations which are required to fabricate VLSI circuits.

In contrast to LOCOS isolation, trench isolation technology has the potential advantages of small width-to-depth ratios, relative process simplicity, well-defined vertical wall isolation regions and surface planarity. Typical trench isolation processes involve etching grooves about 0.6 to 6 micrometers deep into the semiconductor substrate, filling the grooves with a suitable dielectric material and performing a planarization operation. The deposited dielectric material typically is undoped silicon dioxide or polysilicon. However, like other VLSI features, the width of isolation trenches must be scaled downward to near micrometer and even submicrometer size to achieve the densities required in VLSI and future monolithic integrated circuit technologies.

Several approaches have been proposed which have as their purpose the control or elimination of the problems associated with the LOCOS and trench technologies. These approaches are summarized below.

Composite Trench Isolation Processes

A common trench isolation approach involves variations on the basic sequence of etching the trench, forming a thin oxide layer on the trench sidewalls, then filling the trench with oxide or polysilicon. For example, U.S. Pat. No. 4,104,086 to Bondur et al. uses tapered trench sidewalls to control the depth of any voids in relation to the substrate surface and forms a composite dielectric in the trench. The Bondur et al. process includes the steps of forming the trench to a tapered profile, as by the use of reactive ion etching (RIE); growing a thin layer of thermal oxide in the trench outline; filling the trench with CVD oxide; and etching back the CVD oxide by RIE.

U.S. Pat. No. 4,356,211 to Riseman also forms an oxide layer in the trench, but then deposits a conformal layer of polysilicon (poly). The polysilicon is implanted so that differential oxidation of the polysilicon near the surface of the trench encloses the trench and the underlying voids.

U.S. Pat. No. 4,404,735 to Sakurai covers the trench with a layer of deposited silicon dioxide, then forms a CVD layer of silicon or doped glass (phosphosilicate glass, PSG) and reflows the PSG/silicon by laser heating. Essentially, the Sakurai process is a laser reflow process for leveling or planarizing the extreme surface topography which is formed by the combination of the deep trench and the thin silicon or PSG layer. That is, Sakurai forms the trench-filling layer to an initial shallow thickness within the trench and uses laser heating to redistribute material from outside the trenches into the trenches.

Variations on the common approach of oxidizing the trench with polysilicon (or oxide), planarizing the poly by an etchback or "polishing", and oxidizing the poly to form a capping oxide layer are disclosed in Goto et al., *An Isolation Technology for High Performance Bipolar Memories*, IEDM, 1982, pp 58–61; Hayasaka et al., *U-Groove Isolating Technique for High Speed Bipolar VLSI's*, IEDM, 1982 pp 62–65; and Rung et al., *Deep Trench Isolated CMOS Devices*, IEDM, 1982, pp 237–240.

Selective Epitaxial Growth Process

Endo et al., *Novel Device Isolation Technology with Selective Epitaxial Growth*, IEDM, 1982, pp 241–244, forms fine, deep planar VLSI isolation by forming an oxide isolation layer on the bulk substrate, etching trenches in the oxide and then using so-called selective epitaxial growth (SEG) to fill in the active regions. The selective epitaxial silicon growth is provided by forming nitride on the oxide trench sidewalls and growing epitaxial LPCVD silicon on the substrate in the active area-defining oxide trenches.

Modified LOCOS Processes

As mentioned, lateral oxidation at the field edges under the nitride LOCOS oxidation mask limits the device packing density of LOCOS technology. This lateral oxidation is said to be eliminated by applying an extra nitride sealing film between the normal LOCOS oxidation mask and the silicon substrate. See Hui et al., *Electrical Properties of MOS Devices Made with SILO Technology*, IEDM, 1982, pp 220–223.

Lateral oxidation can also be controlled by selectively patterning a nitride on the sidewalls of the silicon mesa after the LOCOS etch, prior to the isolation oxidation. This approach can result in a sharp notched topography at the feature edges. The notches can be controlled by forming a thin oxide layer between the sidewalls and the nitride to allow controlled sidewall oxidation, as disclosed in Kahng et al., *A Method for Area Saving Planar Isolation Oxides Using Oxidation Protected Sidewalls*, J. Electrochem. Soc., Vol. 127, Nov. 1980, pp 2468–2471. Alternatively, oxide deposition and an etchback sequence can be used to refill and level the notches. See Chiu et al., *A Bird's Beak Free Local Oxidation Technology Feasible for VSLI*[sic]*Circuits Fabrication*, IEEE Trans., Electron Devices, Vol. ED-29, No. 4, April 1982, pp 536–540.

The viability of the sidewall masking approaches may be limited due to the creation of defects such as edge dislocations, which may cause increased junction leakage current, device degradation and reliability problems. These problems are discussed, for example, in Fang et al., *Defect Characteristics and Generation Mechanism in a Bird Beak Free Structure by Sidewall Masked Technique*, J. Electrochem. Soc., Jan. 1983, pp 190–196.

Sacrificial Resist Planarizing Processes

Typically, planarization requires spin coating with planarizing materials and etchback, after the trench or field isolation is formed. This approach is used in several of the above articles and patents. Another approach for forming fully recessed planarized dielectric isolation is disclosed in Kurosawa et al., *A New Bird's Beak-Free Field Isolation Technology for VLSI Devices*, IEDM, 1981, pp 384–387. Specifically, after patterning aluminum over the active areas and reactive ion etching field oxide "trenches", a plasma-deposited blanket oxide is formed, and an etchant based on buffered HF is applied to preferentially cut grooves in the stressed oxide of the active area sidewall. The aluminum and overlying oxide are then removed from the active areas using boiling $H_2O_2/H_2SO_4$. After lift-off, the grooves are filled and the field oxide planarized by depositing CVD oxide, spinning-on resist, reactive ion etching the resist and CVD oxide at equal rates to below the grooves, then applying a solution etchant to complete the etch to the active area silicon surface.

Other processes for planarizing or leveling oxide are disclosed in Hom-ma et al., *LSI Surface Leveling by RF Sputter Etching*, J. Electrochem. Soc., Vol. 126, No. 9, 1979, pp 1531–1533, which involves the sputter etching of stabilizied organic resist; Adams et al., *Planarization of Phosphorus-Doped Silicon Dioxide*, J. Electrochem. Soc., Vol. 128, No. 2, 1981, pp 423–429, which involves the plasma etching of organic resist to planarize phosphorus-doped oxide; and copending and commonly assigned patent application having Ser. No. 667,181.

In view of the above-discussed constraints and difficulties associated with the available isolation processes and structures and, further, in view of the typically complex sequences which are used to form narrow, deep fully recessed dielectric structures and to planarize such structures, it is an object of the present invention to provide an efficient and reproducible process for forming trench isolation structures of variable surface geometry.

It is also an object of the present invention to provide a relatively simple process for forming isolation structures, in the sense that all layers necessary to the process, except the dielectric itself, are grown or deposited in a single sequence, and all patterning, from photolithographic mask definition through substrate etching, is done in a single etch sequence.

SUMMARY OF THE INVENTION

The present invention is a process for fabricating a fully recessed planar silicon oxide structure in a silicon substrate depression or trench and is based upon the conversion of an organosilicon material to silicon oxide. In one aspect, the process is implemented by selectively depositing the organosilicon material in a trench or depression formed in the substrate and to a height which is selected to provide a planar silicon oxide-substrate surface topography upon conversion of the organosilicon material to silicon oxide. The trench or depression is bounded by a silicon substrate step surface coated with a polymer material which is not wetted by the solvents carrying the organosilicon material, so that the organosilicon material is selectively deposited in the trench but not on the step surface. The organosilicon material is then heated to convert the material to silicon oxide.

The organosilicon material is selected from orthosilicate esters or siloxane resins. Suitable polymer materials which are non-wetted by solvents carrying the organosilicon material include spun-on and cured fluorocarbon epoxies or plasma-deposited fluorocarbon materials. Representative fluorocarbon materials would include but not be limited to fluorinated diglycidyl ethers, fluorinated aromatic diols, and polyols produced by the reaction of such ethers and diols. The listed organosilicon materials are conveniently converted to silicon oxide by heating to a temperature within the range of about 200° C.–900° C.

As mentioned above in discussing the objectives of the invention, prior art planarized isolation technology involves rather complicated processing sequences. Typically, the prior art process sequences involve multiple repetitions of the sequence of layer formation and etching. Thus, for example, the above-referenced sidewall-masked modified-LOCOS process sequence may involve forming the first pad oxide and nitride layers, patterning the first pad oxide and nitride layers, etching the substrate, forming the second pad oxide and nitride layers, patterning the second nitride layer, growing the isolation oxide, and etching back/leveling the isolation oxide. A composite trench isolation process may typically involve forming and patterning a trench etch mask, cutting the trench in the substrate, forming the trench dielectric, etching back/planarizing the trench dielectric, and forming a capping oxide layer. Such complexity is avoided in the present invention because the organosilicon conversion process is self-planarizing and because the process is adaptable to separate the stack formation and patterning sequences which are implemented prior to formation of the trench dielectric. The other process steps are readily implemented, non-critical blanket stripping steps.

In a further, specific aspect which reflects the single stack-formation and patterning sequences, the present invention is a process for fabricating a fully recessed silicon oxide structure in a silicon substrate trench from converted organosilicon material, and comprises selectively forming on the substrate surface a coating of polymer material which is non-wetting to the solution of the organosilicon material and which is patterned as the complement of the trench area; forming the trench in the substrate bounded by the complementarily-patterned polymer coating; applying the organosilicon material in the trench, as by spin coating, to a height which is selected to provide a planar silicon oxide layer level with the substrate surface upon conversion of the organosilicon material; and converting the organosilicon material by heating.

In a more specific aspect which reflects the single stack formation and patterning sequences, the process comprises forming in order on the silicon substrate multiple layers which include a layer of silicon oxide, a layer of polymer material selected from fluorocarbon-type materials non-wettable by organosilicon solutions, a photoresist adhesion enhancing layer of dielectric material selected from silicon oxide and silicon nitride, and a photoresist etch mask layer; sequentially etching the stack layers and the underlying substrate to form the substrate trench and to strip the etch mask and the adhesion enhancing dielectric layer; selectively depositing the organosilicon material within the trench by spin coating; converting the organosilicon material; stripping the non-wetting polymer layer; and, by heating, completing the conversion of the organosilicon material to silicon oxide.

The advantages of this process include the reproducible fabrication of fully recessed, self-planarizing isolation; a well-defined substrate-to-isolation region boundary; low temperature processing; and relative process simplicity.

BRIEF DESCRIPTION OF THE DRAWINGS

The above and other aspects of the present invention are described in detail in conjunction with the attached drawings in which.

DETAILED DESCRIPTION OF THE INVENTION

Figure 1:
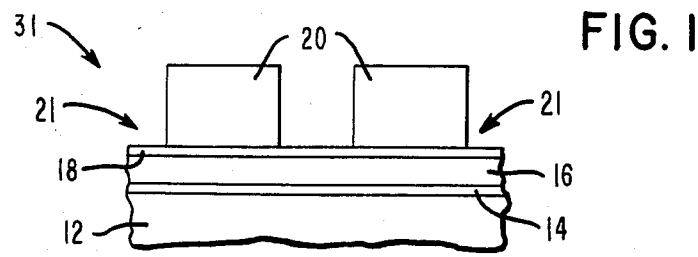
FIGS. 1 through 5 are cross-sectional representations of a monolithic integrated circuit taken sequentially during, and illustrating the key steps of, a preferred process sequence for forming a fully recessed planarized dielectric isolation structure.

In terms of an overview, the technique of the present invention involves the selective deposition of an organosilicon material (28, FIG. 4) on integrated circuit recessed areas or trenches (22, FIG. 2) which are wetted to the organosilicon material. Elevated active areas of the integrated circuit (26, FIG. 3) are covered with a polymer film (16A, FIG. 3) which is not wetted to the organosilicon material. Thus, during spin coating of the organosilicon material 28, the wettable trench areas 22 experience a build-up of the organosilicon material, while the non-wettable areas covered by the polymer material repel the coating solution. The build-up of the organosilicon compound 28 is continued until the surface of the interface is planar, or, where the material 28 shrinks during heating, to a thickness which provides planarity or near-planarity upon heating. After the deposition of the organosilicon material, the organosilicon material can be heated in the presence of the non-wetting layer to partially convert the organosilicon to silicon dioxide, or the non-wetting layer can first be stripped with a plasma oxygen ash operation and then fully heated for complete conversion to silicon dioxide (280, FIG. 5), where heating is typically at 200°–900° C. The resulting structure (35, FIG. 5) is a fully recessed, planar isolation structure in which the converted silicon dioxide (280) serves as the dielectric isolation material, and in which the as-deposited thickness of the organosilicon material is selected to form a planar surface 29 which after conversion is level with oxide layer 14.

Figure 3:
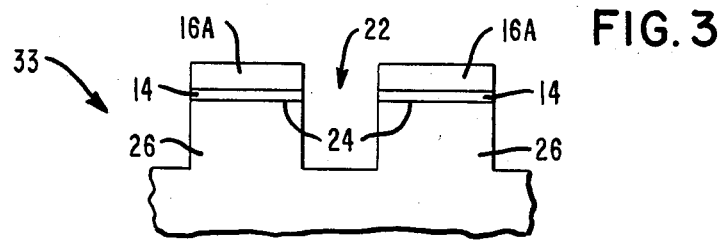

Alternatively, of course, where the oxide layer 14 is absent, the organosilicon material can be formed level with the silicon substrate surface 24 (FIG. 3).

The starting structure for implementing the fully recessed planarized isolation process is illustrated in FIG. 1. There is shown a silicon substrate 12 which is coated with a dielectric film 14, typically silicon dioxide formed to a thickness of about 50 nanometers (nm) by thermal oxidation or chemical vapor deposition (CVD). The oxide layer 14 acts as a contamination barrier between the substrate 12 and the overlying non-wetting polymer coating 16. The polymer coating 16 is selected from the materials such as fluorocarbon epoxies which are applied by spin coating and cured to impart non-wetting properties or fluorocarbon materials deposited through plasma enhanced CVD from $CF_4$, $CHF_3$ or other gases. Representative materials from the former class include fluorinated diglycidyl ethers, fluorinated aromatic diols and polyols produced by the reaction of such ethers and diols. Typically, the non-wetting polymer coating 16 is 10–200 nanometers thick. A wetting layer 18 is formed on the non-wetting polymer coating 16 for enhancing the adhesion of the coating 16 to photoresist mask 20. Typically, the wetting layer 18 is silicon oxide or silicon nitride formed to a thickness of about 50 nm by CVD, plasma enhanced CVD or sputtering.

Referring still further to FIG. 1, a photoresist layer is deposited and patterned to provide an etch mask 20 which defines the desired trench pattern in the underlying stack of layers. However, those skilled in the art will appreciate that the substrate can be masked by a number of materials in addition to the exemplary photoresist mask 20. For example, resist compositions suitable for X-ray or e-beam lithographies can be used. Using photoresist, a layer thereof is formed on the oxide or nitride 18, then is exposed and developed to produce the etch mask 20 which has openings 21 corresponding to the desired trench outline. Please note, the drawings herein are chosen for convenience of representation and are not to scale.

Figure 2:
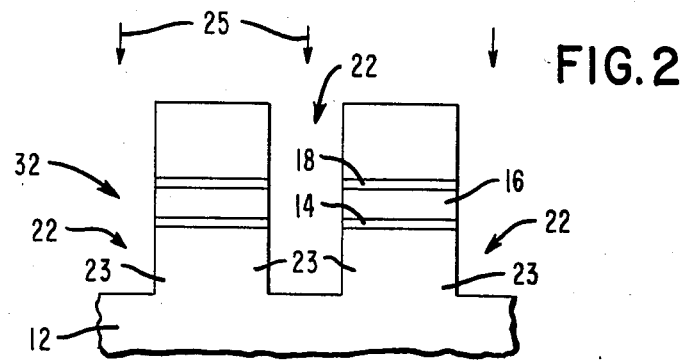

Next, the referring to FIG. 2, the stack of layers 18, 16, 14 and the substrate 12 are sequentially etched using an anisotropic etch process to produce trenches or recesses 22—22 having vertical sidewalls 23—23 in substrate 12. For example, ion milling can be used. One preferred etch process is reactive ion etching. An $NF_3$ and oxygen etchant gas system can be used. This reactive gas composition can be varied without removing the integrated circuit 32 from the processing chamber to sequentially remove the oxide/nitride 18, polymer 16, oxide 14 and silicon 12 in a continuous, single etching sequence. In addition, some of photoresist mask 20 is removed in the etch process during the oxygen RIE of the non-wetting fluorocarbon layer 16. Any remaining photoresist can be removed with oxygen plasma ash operation or with solvent strippers such as acetone. Also, the dielectric layer 18 is removed during the trench etching sequence if $NF_3$ gas is used.

The described reactive ion etching process is preferred in that in addition to the ability to etch in a single sequence, the mechanical component or ion bombardment component 25 of the etching species dominates the chemical reaction component and provides vertical sidewalls. These characteristics are highly desirable in providing sufficient dielectric width for effective isolation without lateral encroachment into the active device areas.

It should be noted that the minimum spacing between the sections of the mask 20 is determined by lithographic limitations. Using the disclosed reactive ion etching processing in conjunction with advanced optical lithography, it is possible to obtain minimum spacings 22 of less than one micrometer.

In short, the above-described RIE not only sequentially patterns layers 18, 16 and 14 and defines trench 22, but also can if appropriately specified remove the photoresist mask 20 and the dielectric layer 18. This process leaves structure 33, FIG. 3, in which segments 16A—16A of the non-wetting layer 16 are defined on wetting layer 14 over the upper surfaces 24—24 of the silicon substrate steps 26—26, which steps were formed by the trench etch.

Figure 4:
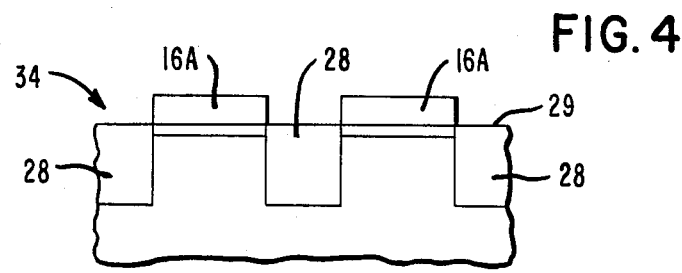

Referring to FIG. 4, the next step is to selectively deposit an organosilicon layer 28 into the recess or trenches 22—22. Organosilicon materials and, in particular organosilicon materials selected from the group of orthosilicate esters or siloxane resins are preferred because they possess several crucial properties which are necessary to the success of the process. First, solutions of such materials do not wet to, that is, do not adhere to the particular polymer coatings 16A—16A, but do adhere tightly to silicon. This permits selective deposition of the organosilicon material in the recesses or trenches 22—22 without build-up of the material on top of the substrate steps 26—26 covered by polymer coatings 16A—16A. Also, the organosilicon materials are deposited from solution by spin-on coating and provide a planar, level surface topography. Typically, the organosilicon filling 28 is deposited by spinning-on at 3,000-5,000 rpm so that, after conversion, the outer surface 29 thereof is level with the silicon upper surface 24 (FIG. 3) or with the top surface of oxide barrier layer 14. Deposition of organosilicon film 28 is followed by removal of the non-wetting layer 16A—16A in oxygen plasma ash operation.

Figure 5:
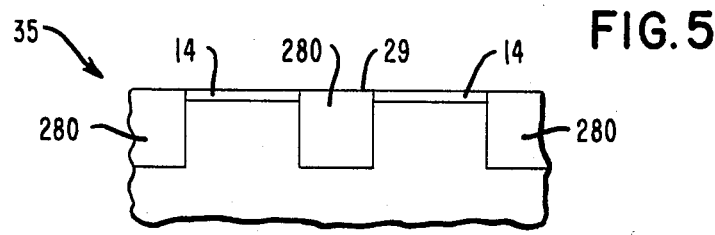

Referring now to FIG. 5, the conversion of the organosilicon material 28 to silicon dioxide 280 is conveniently done by heating the integrated circuit structure in an argon, nitrogen or oxygen atmosphere at a temperature of about 200° C.-900° C.

It may on occasion be preferred to set or partially convert organosilicon material 28 (FIG. 4) to silicon dioxide prior to removing non-wetting layer 16A—16A. If the non-wetting layer 16A—16A is selected to have a suitable temperature capability, it is possible to undertake conversion of organosilicon material 28 to silicon dioxide by conditioning at the lower end of the temperature range set forth above.

The resulting fully recessed, self-planarized structure 35 is shown in FIG. 5. At this point, normal integrated circuit processing can resume to form the desired IC structures.

Having thus described preferred and alternative embodiments of the present invention, what is claimed is:

1. A process for fabricating a planarized recessed silicon oxide structure in a silicon substrate trench from converted organosilicon material, comprising selectively depositing a layer of organosilicon material in a substrate trench to a height selected to provide a planar silicon oxide-substrate topography upon conversion of said material, the trench being bounded by a silicon substrate surface having thereon a coating of polymer material which is non-wetting to the layer of organosilicon material; and, heating the organosilicon material to convert said material to silicon oxide.

2. A process for fabricating a planarized recessed silicon oxide structure in a silicon substrate trench from converted organosilicon material selected from orthosilicate esters or siloxane resins, comprising selectively depositing the organosilicon material in the substrate trench by spin coating to a height selected to provide a planar silicon oxide-substrate topography upon conversion of said material, the trench being bounded by a silicon substrate surface having thereon a coating of polymer material selected from fluorocarbon compounds which are non-wetting to the solution of organosilicon material; and heating the organosilicon material to a temperature within the range of about 200° C.-900° C. to convert said material to silicon oxide.

3. A process for fabricating a recessed silicon oxide structure from converted organosilicon material in a silicon substrate recess, comprising:
selectively forming on the substrate surface a coating of polymer material selected from fluorocarbon compounds, said polymer coating being non-wetting to the organosilicon material and being patterned in the complement of the recess area;
spin coating organosilicon material selected from orthosilicate esters or siloxane resins in the trench to a height selected to provide a planar silicon oxide-substrate topography upon conversion of said organosilicon material; and
heating said organosilicon material to a temperature within the range of about 200° C.-900° C. to convert said organosilicon material to silicon oxide.

4. A process for fabricating a recessed silicon oxide structure in a silicon substrate trench from converted organosilicon material selected from orthosilicate esters or siloxane resins comprising:
forming in order on the silicon substrate a layered stack comprising a layer of silicon oxide, a layer of polymer material selected from fluorocarbon compounds which do not adhere to said organosilicon material, and a dielectric layer selected from silicon oxide and silicon nitride;
sequentially etching the layers of the stack and the underlying substrate to define the trench in the substrate;
selectively depositing said organosilicon material to a height within the trench selected to provide a silicon oxide outer surface which is substantially level with the silicon substrate outer surface upon conversion of said organosilicon material, said polymer layer preventing deposition on the silicon substrate outer surface; and
heating said organosilicon material to convert said material to silicon oxide.

5. The process of claim 4 wherein the heating step is done at a temperature of about 200° C.-900° C.

6. A process for fabricating a recessed silicon oxide structure in a silicon substrate trench from converted organosilicon material selected from orthosilicate esters or siloxane resins comprising:
forming in order on the silicon substrate a layered stack comprising a layer of silicon oxide, a layer of polymer material selected from fluorocarbon compounds which are not wetted by said organosilicon material solution, and a dielectric layer selected from silicon oxide and silicon nitride;
forming a patterned layer of resist on the dielectric layer;
sequentially patterning the layers of the stack and the underlying substrate in the presence of the resist to define the trench in the substrate and remove the resist and the dielectric layer;
spin coating said organosilicon material within the trench to a selected height, said polymer layer preventing deposition on the silicon substrate outer surface;
removing the non-wetting polymer layer; and
heating said organosilicon material to a temperature within the range of about 200° C.-900° C. to convert said material to silicon oxide.

7. The process of claim 4 or 6 wherein the thickness of the silicon oxide is about 50 nm, the thickness of the polymer layer is about 10-200 nm, and the thickness of the dielectric layer is abut 50 nm.

* * * * *